United States Patent
Chang

(10) Patent No.: US 7,538,706 B2
(45) Date of Patent: May 26, 2009

(54) MASH MODULATOR AND FREQUENCY SYNTHESIZER USING THE SAME

(75) Inventor: Hsiang-Hui Chang, Taipei Hsien (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 11/860,555

(22) Filed: Sep. 25, 2007

(65) Prior Publication Data

US 2009/0079605 A1    Mar. 26, 2009

(51) Int. Cl.
*H03M 3/00* (2006.01)

(52) U.S. Cl. .................. 341/143; 341/118; 341/120; 341/155; 331/16; 331/1 A; 331/23; 331/25; 375/224; 375/373; 375/376; 375/375

(58) Field of Classification Search .............. 341/143; 331/16, 1 A, 34, 23, 25; 375/224, 373, 376, 375/375

See application file for complete search history.

(56) References Cited

U.S. PATENT DOCUMENTS

| | | | | |
|---|---|---|---|---|
| 5,781,044 A * | 7/1998 | Riley et al. | ............... | 327/105 |
| 6,075,474 A * | 6/2000 | Gabet et al. | ............... | 341/143 |
| 6,587,063 B1 * | 7/2003 | Su | ............... | 341/143 |
| 6,594,330 B1 * | 7/2003 | Wilson | ............... | 375/376 |
| 6,707,855 B2 * | 3/2004 | Patana | ............... | 375/244 |
| 6,822,593 B2 * | 11/2004 | Level et al. | ............... | 341/143 |
| 6,844,836 B1 * | 1/2005 | Lee | ............... | 341/143 |
| 7,123,101 B2 * | 10/2006 | Puma et al. | ............... | 331/16 |
| 7,187,313 B1 * | 3/2007 | Yuan | ............... | 341/143 |
| 7,324,030 B2 * | 1/2008 | Riley | ............... | 341/143 |
| 2003/0108143 A1 * | 6/2003 | Han et al. | ............... | 377/47 |
| 2007/0008202 A1 * | 1/2007 | Puma | ............... | 341/143 |
| 2007/0182611 A1 * | 8/2007 | Yu | ............... | 341/143 |
| 2007/0222527 A1 * | 9/2007 | Pretl | ............... | 331/34 |

* cited by examiner

*Primary Examiner*—Linh V Nguyen
(74) *Attorney, Agent, or Firm*—Thomas, Kayden, Horstemeyer & Risley

(57) ABSTRACT

A MASH modulator. The MASH modulator receives a fractional input value, generates an integer output value, and comprises three cascaded first order sigma delta modulators (SDMs) each comprising an accumulator, a plurality of first multipliers, a second multiplier, a first adder, and a second adder. Each of the first multipliers is coupled to a corresponding accumulator. The first adder receives the fractional input value. The second multiplier is coupled between the first adder and the cascaded first order sigma delta modulators. The second adder is coupled to the cascaded first order sigma delta modulators to generate the integer output value.

12 Claims, 9 Drawing Sheets

MASH MODULATOR AND FREQUENCY SYNTHESIZER USING THE SAME

BACKGROUND OF THE INVENTION

1. Field of the Invention

The invention relates to a MASH modulator and, in particular, to a MASH modulator with fewer logic circuits to improve fractional spur thereof.

2. Description of the Related Art

To satisfy the demands of multi-mode frequency planning, fractional synthesizers have been widely used for local oscillator (LO) frequency generation in wireless applications. However, such fractional synthesizers suffer serious fractional spur problems in output spectrum thereof. For example, in a case of small fractional number, the fractional spur cannot be filtered out by a loop filter in a phase locked loop (PLL) of the fractional synthesizer, and will remain in-band. For multi-mode frequency planning, the small fractional number is not avoidable and the non-filtered spur impacts system performance significantly. To solve this problem, conventionally, sigma delta modulators (SDMs) are adopted in frequency synthesizers. The fractional spur will be suppressed as the order of the SDM increases. Generally, SDMs of an order higher than 2 are widely used.

Another cause of the fractional spur is nonlinearity in the PLL. The nonlinearity could result from timing mismatch in a phase frequency detector (PFD) or current mismatch in a charge pump. When the frequency synthesizer uses a high order SDM, the mismatch between UP/DN currents of the charge pump becomes a major cause of fractional spur. To keep the fractional spur low, demands on current matching are stringent. With 5% current mismatch, the in-band fractional spur might be greater than −40 dB below a carrier.

FIG. 1 is a block diagram of a conventional MASH modulator. The conventional MASH modulator comprises three cascaded first order sigma delta modulators (SDMs). The input of the next stage SDM is the quantization noise of the previous stage SDM. The quantization noises of the intermediate stage SDM are then all digitally cancelled. Thus, only the quantization noise from the last stage SDM is left and MASH becomes stable. However, there are still some defects in MASH architecture. For example, the quantization noise cancellation is sensitive to the gain matching accuracy between each stage of MASH. In addition, more operational amplifiers and more capacitors are required in MASH than in classical architecture such that the chip size of MASH increases. The MASH modulator is often used in a PLL due to inherent stability thereof. In such a MASH modulator, a fractional number is typically synthesized by two integers, 0 or 1. When the fractional number is close to 0 or 1, the MASH SDM outputs almost 0 or 1, respectively. Thus, the in-band fractional spur will remain inband due to nonlinearities of the PLL and cannot be attenuated by a filter thereof.

BRIEF SUMMARY OF THE INVENTION

An embodiment of a MASH modulator receives a fractional input value and comprises three cascaded first order sigma delta modulators (SDMs), each comprising an accumulator, a plurality of first multipliers, a second multiplier, a first adder, and a second adder. Each of the first multipliers is coupled to a corresponding accumulator. The first adder receives the fractional input value. The second multiplier is coupled between the first adder and the cascaded first order sigma delta modulators. The second adder is coupled to the cascaded first order sigma delta modulators and generates the integer output value.

An embodiment of a MASH modulator comprises first, second, and third cascaded accumulators, first, second, third, and fourth adders, and first, second, third, and fourth multipliers. The first and second adders are respectively coupled to the first and second accumulators. The first delay unit is coupled between the first and second adders. The second delay unit is coupled between the second adder and the third accumulator. Each of the first and second multipliers, coupled between a corresponding adder and a corresponding accumulator, multiplies an output value of the corresponding accumulator by a first predetermined number. The third multiplier, coupled between the second delay unit and the third accumulator, multiplies an output value of the third accumulator by the first predetermined number. The third adder, coupled between the first adder and an output of the MASH modulator, adds a second predetermined number to an output value from the first adder. The fourth adder, coupled to an input of the MASH modulator, adds a third predetermined number to an input value thereof. The fourth multiplier, coupled between the fourth adder and an input of the first accumulator, multiplies an output value of the fourth adder by a fourth predetermined number. The third predetermined number is a negative of the second predetermined number and the fourth predetermined number an inverse of the first predetermined number. The first, second, third, and fourth predetermined numbers are determined according to the input value.

An embodiment of a frequency synthesizer comprises a phase locked loop and the disclosed MASH modulator. The phase locked loop comprises a frequency divider and the disclosed MASH modulator coupled thereto.

The invention provides a MASH modulator and a frequency synthesizer having the same. The MASH modulator of the invention requires few logic circuits to reduce the in-band fractional spur. Using the MASH modulator of the invention, requirements of current matching in a frequency synthesizer are not as stringent as those in a conventional one.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
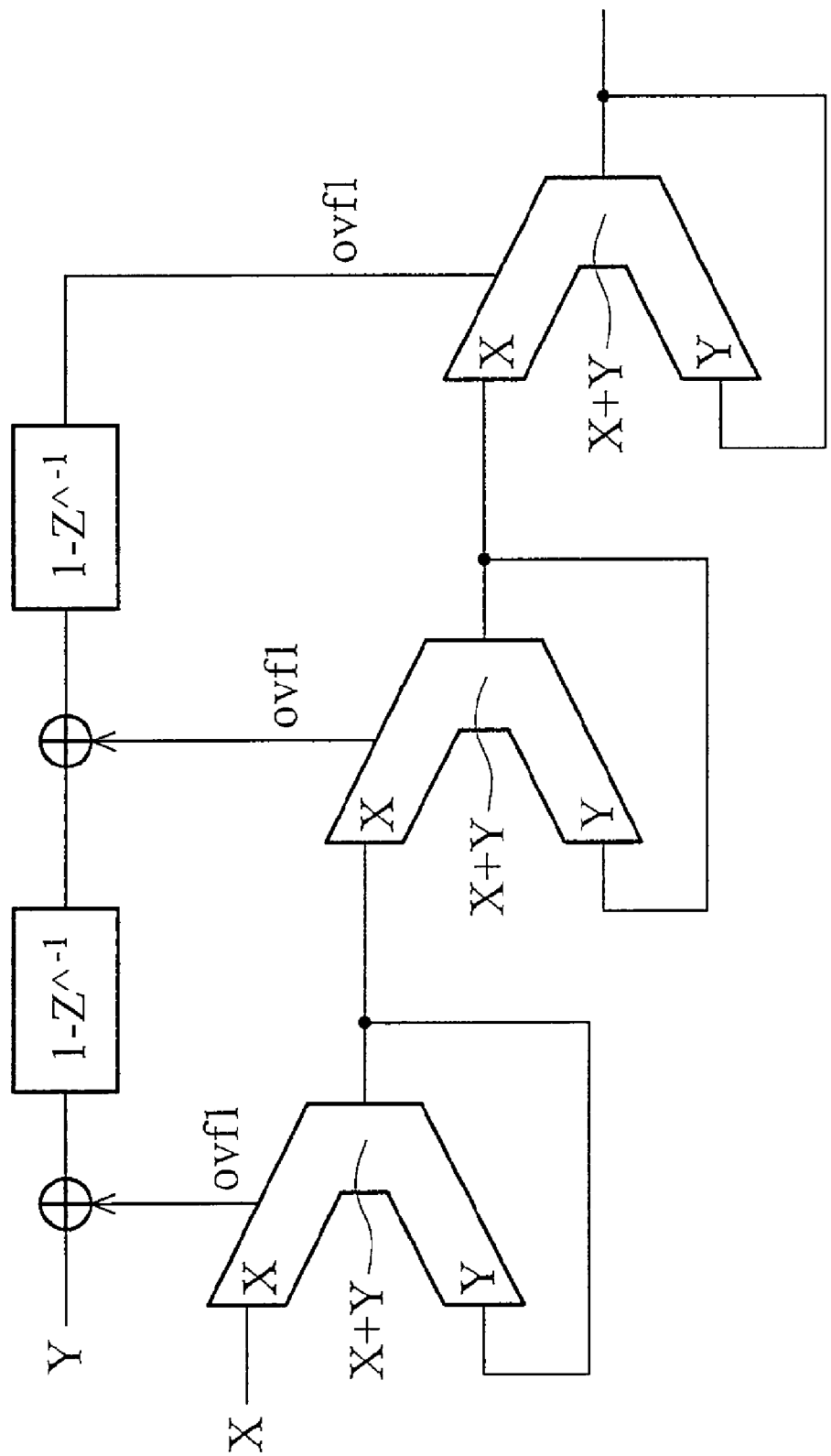
FIG. 1 is a block diagram of a conventional MASH modulator.
Figure 2:
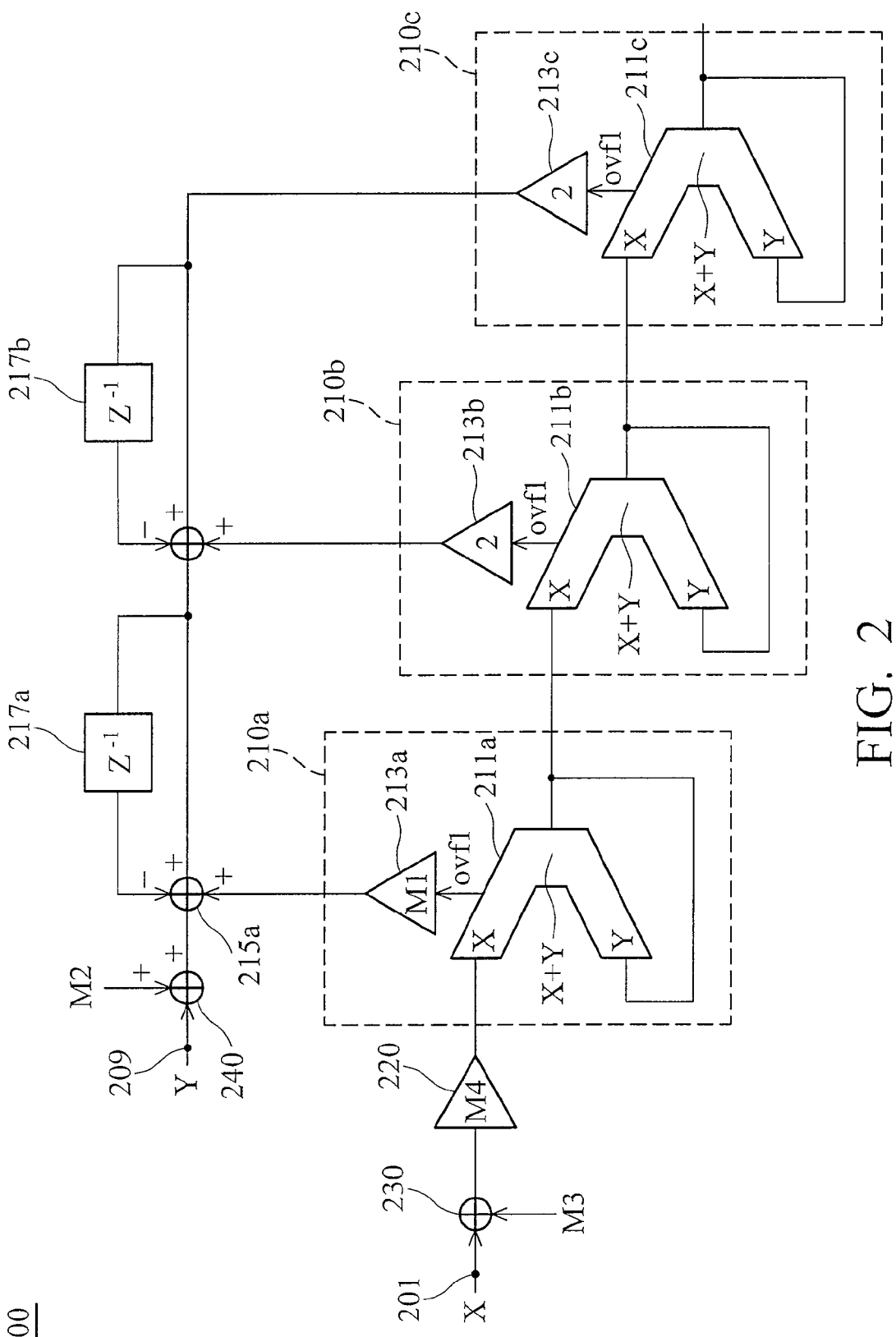
FIG. 2 is a schematic diagram of a MASH modulator according to an embodiment of the invention.

FIG. 2 is a schematic diagram of a MASH modulator according to an embodiment of the invention. The MASH modulator receives a fractional input value X, generates an integer output value Y, and comprises three cascaded first order sigma delta modulators (SDMs) 210a, 210b, and 210c, a plurality of multipliers 213a, 213b, and 213c, and 220, and a plurality of adders 215a, 215b, 230, and 240. Each of the cascaded first order sigma delta modulators (SDMs) 210a, 210b, and 210c comprises an accumulator 211a, 211b, or 211c. Each of the multipliers 213a, 213b, and 213c is coupled to a corresponding accumulator 211a, 211b, or 211c. The adder 230 receives the fractional input value X. The multiplier 220 is coupled between the adder 230 and the cascaded first order sigma delta modulators 210a, 210b, and 210c. The adder 240 is coupled to the cascaded first order sigma delta modulators 210a, 210b, and 210c and generates the integer output value Y.

More specifically, the MASH modulator according to an embodiment of the invention comprises first, second, and third cascaded accumulators 211a, 211b, and 211c, first, second, third, and fourth adders 215a, 215b, and first, second, third, and fourth multipliers 213a, 213b, 213c, and 220. The first and second adders 215a and 215b are respectively coupled to the first and second sigma delta modulators 210a and 210b. The first delay unit 217a is coupled between the first and second adders 215a and 215b. The second delay unit 217b is coupled between the second adder 215b and the third sigma delta modulator 210c. Each of the first and second multipliers 213a and 213b, coupled between a corresponding adder 215a and 215b and a corresponding accumulator 211a and 211b, multiplies an overflow value ovf1 thereof by a first predetermined number M1. The third multiplier 213c, coupled between the second delay unit 217b and the third accumulator 211c, also multiplies an overflow value ovf1 thereof by the first predetermined number M1. The third adder 240, coupled between the first adder 215a and an output 209 of the MASH modulator 200, adds a second predetermined number M2 to an output value of the first adder 215a to generate an integer output value Y thereby. The fourth adder 230, coupled to an input 201 of the MASH modulator 200, adds a third predetermined number M3 to an input value X thereof. The fourth multiplier 220, coupled between the fourth adder 230 and an input of the first sigma delta modulator 210a, multiplies an output value of the fourth adder 230 by a fourth predetermined number M4. In some embodiments, the third predetermined number M3 could be a negative of the second predetermined number M2, and the fourth predetermined number M4 could be an inverse of the first predetermined number M1. In addition, the first, second, third, and fourth predetermined numbers M1, M2, M3, and M4 could be determined according to the input value.

Figure 3A:
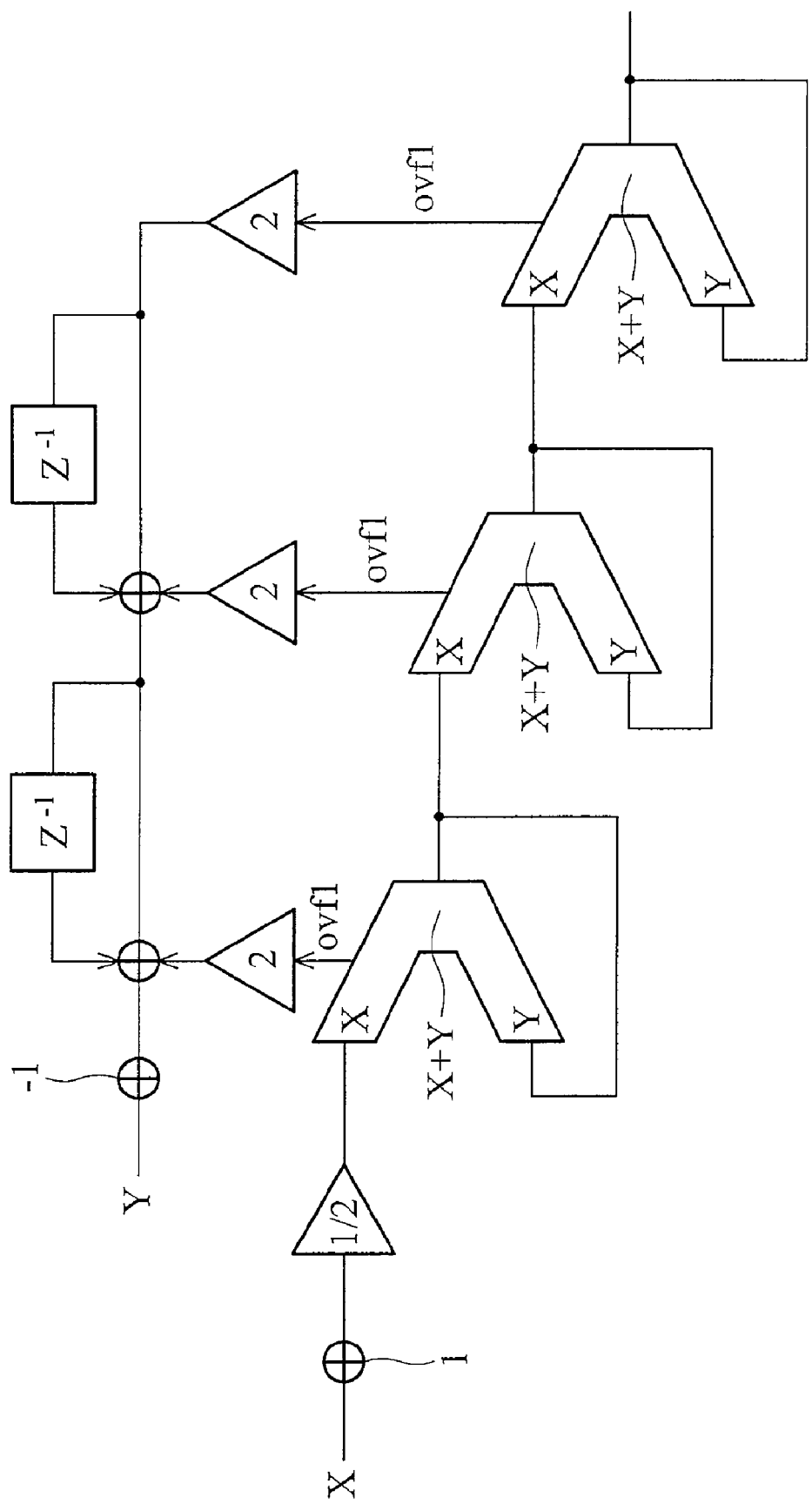
FIG. 3A is a schematic diagram of the MASH modulator in FIG. 2 when the fractional input value X is approximately 0.
Figure 3B:
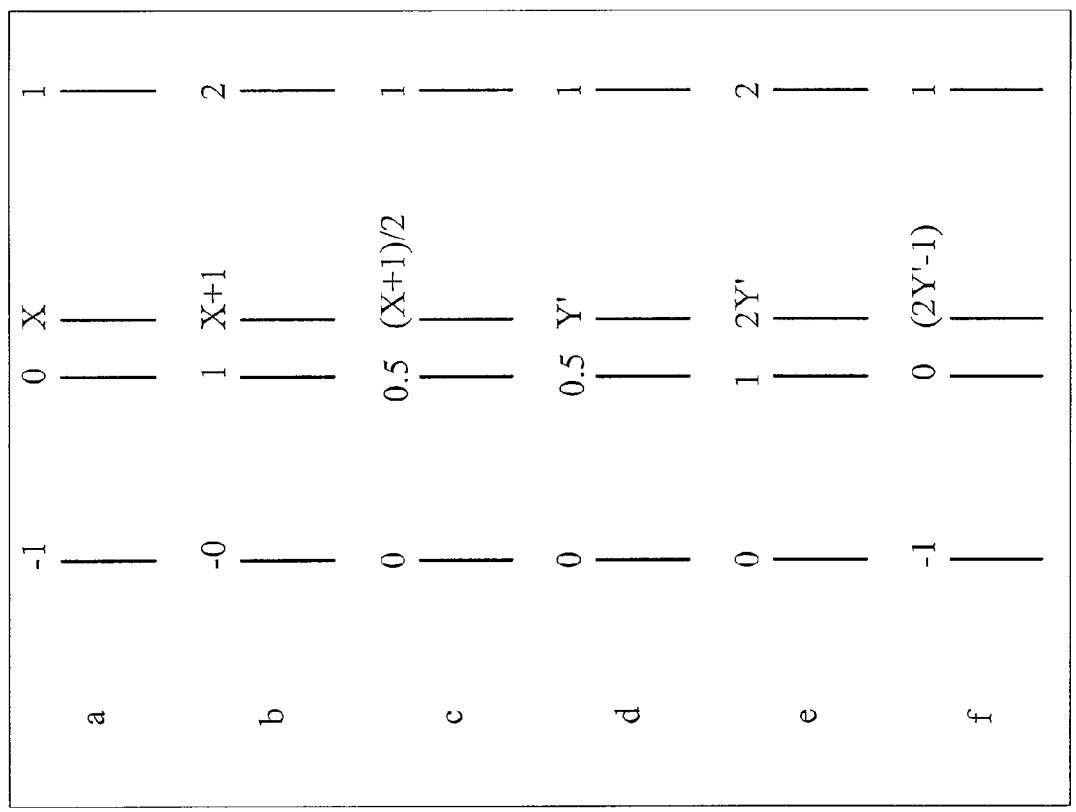
FIG. 3B is a schematic diagram showing operation flow of the MASH modulator in FIG. 2 when the fractional input value X is approximately 0.

It is known that frequency distribution of fraction spur can be expressed as $f_{fractional\_spur}=F_{ref}*\alpha$, where Fref is reference frequency, and α is fractional number. For a multi-mode frequency synthesizer, the condition, in which α is close to 0 or 1, is unavoidable. The MASH modulator according to an embodiment of the invention uses two integers, −1 and 1 to synthesize a number close to 0. A detailed schematic diagram and operation flow of the MASH modulator when the fractional input value X is approximately 0 are respectively shown in FIGS. 3A and 3B. In FIG. 3A, the MASH modulator uses two integers, −1 and 1 to synthesize a number close to 0. The operation of the MASH modulator of the invention is as follows as shown in FIG. 3B. In a case where the fractional input value X is close to 0, X would be increased by 1 and then divided by 2 (multiplied by ½) as shown in (b) and (c). As a result, an input value of the accumulator 211a is close to 0.5 rather than 0. Accordingly, fractional spur will be pushed to out-band and can be filtered by a loop filter in a frequency synthesizer. In other words, the cascaded SDMs 210a, 210b, and 210c use the integers 0 and 1 to synthesize the modified fractional number which is originally close to 0. By making the modified fractional number close to center of quantization level, fractional spur is thus pushed to near half of the reference frequency Fref and can be attenuated by a loop filter in a frequency synthesizer. To get the same average number, output values of the accumulators 211a, 211b, and 211c could be multiplied by 2, and then an output value of the adder 215a is subtracted by 1 as shown in (e) and (f).

Figure 4A:
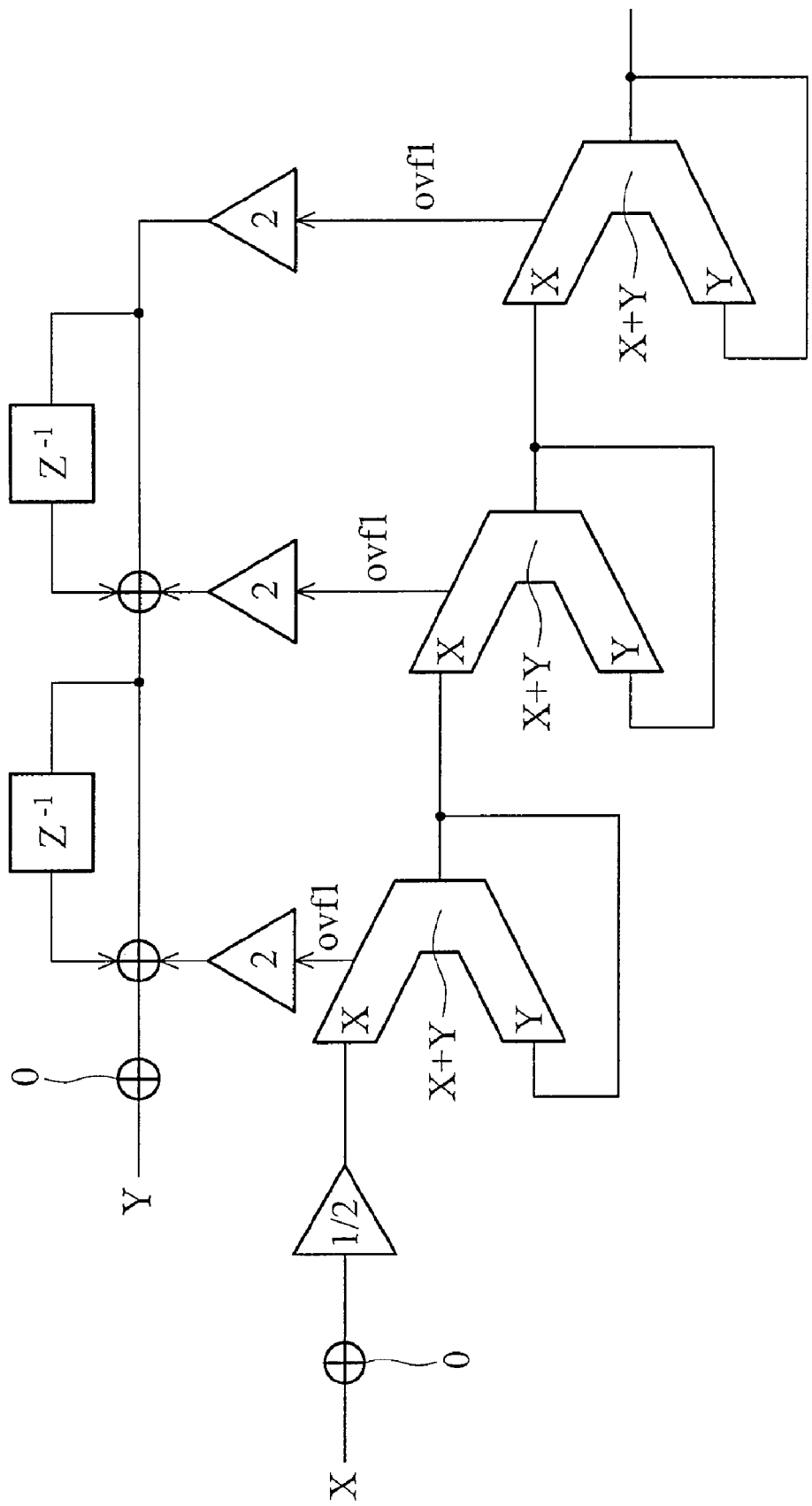
FIG. 4A is a schematic diagram of the MASH modulator in FIG. 2 when the fractional input value X is approximately 1.
Figure 4B:
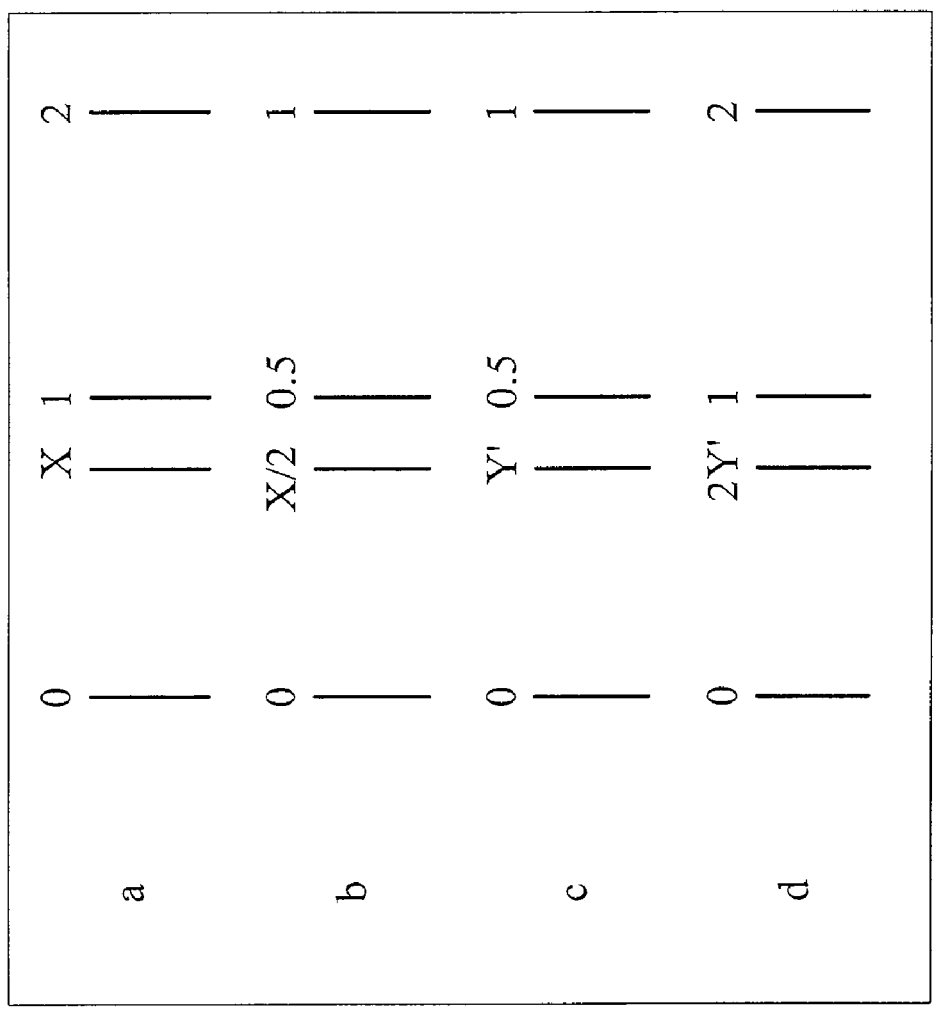
FIG. 4B is a schematic diagram showing operation flow of the MASH modulator in FIG. 2 when the fractional input value X is approximately 1.

A detailed schematic diagram and operation flow of the MASH modulator when the fractional input value X is approximately 1 are respectively shown in FIGS. 4A and 4B. In FIG. 4A, the MASH modulator uses two integers, 0 and 2 to synthesize a number close to 1. The operation of the MASH modulator of the invention is as follows, as shown in FIG. 4B. In a case where the fractional input value X is close to 1, X would be increased by 0 and then divided by 2 (multiplied by ½) as shown in (a) and (b). As a result, an input value of the accumulator 211a is close to 0.5 rather than 0. Accordingly, fractional spur will be pushed to out-band and can be filtered by a loop filter in a frequency synthesizer. In other words, the cascaded SDMs 210a, 210b, and 210c use the integers 0 and 1 to synthesize the modified fractional number which is originally close to 1. By making the modified fractional number close to center of quantization level, fractional spur is thus pushed to near half of the reference frequency Fref and can be attenuated by a loop filter in a frequency synthesizer. To get the same average number, output values of the accumulators 211a, 211b, and 211c could be multiplied by 2, and then an integer output value Y is generated as shown in (c) and (d).

Figure 5A:
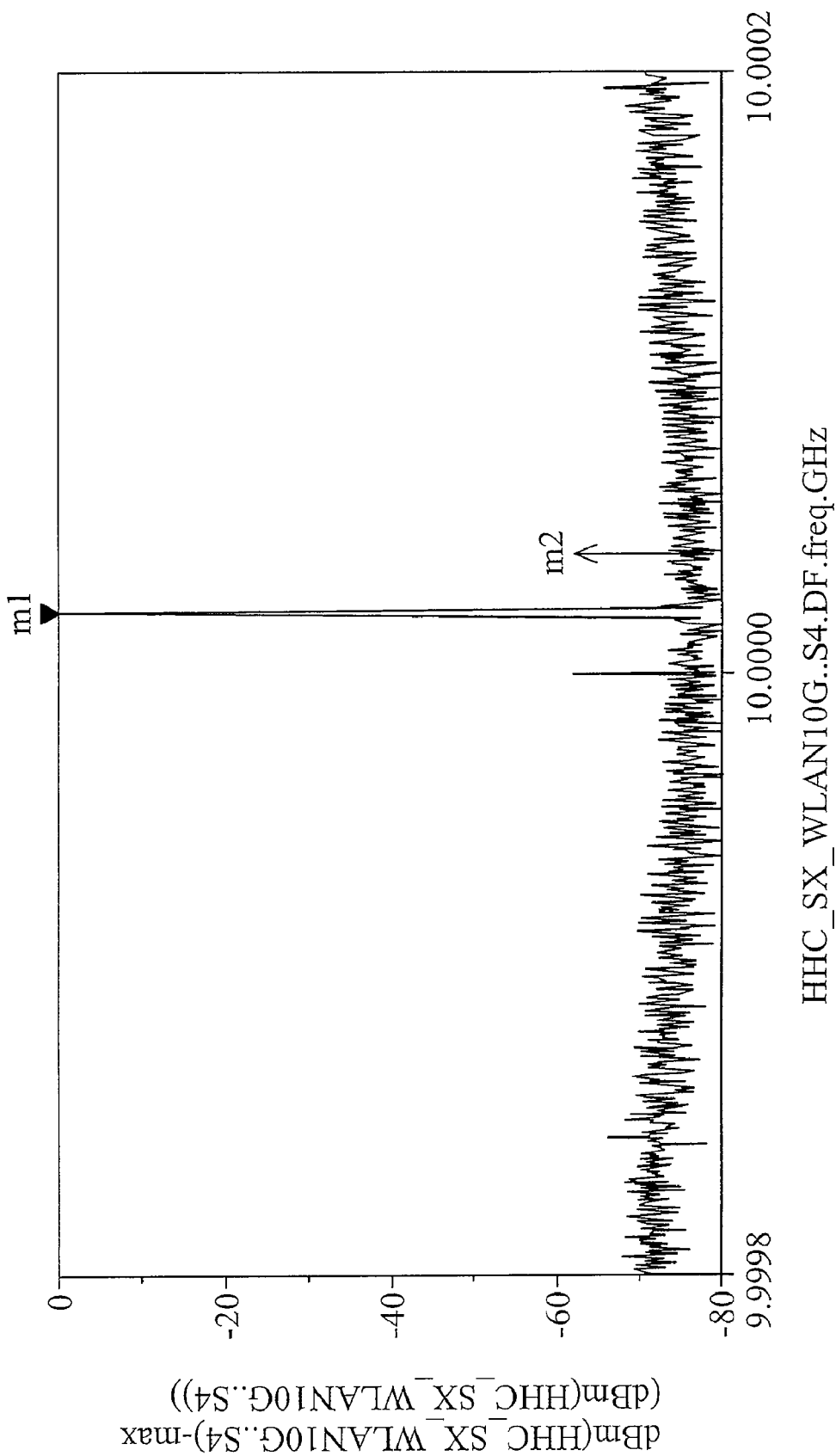
FIGS. 5A and 5B respectively show simulated results of a frequency synthesizer using a conventional MASH modulator and a MASH modulator according to an embodiment of the invention.
Figure 5B:
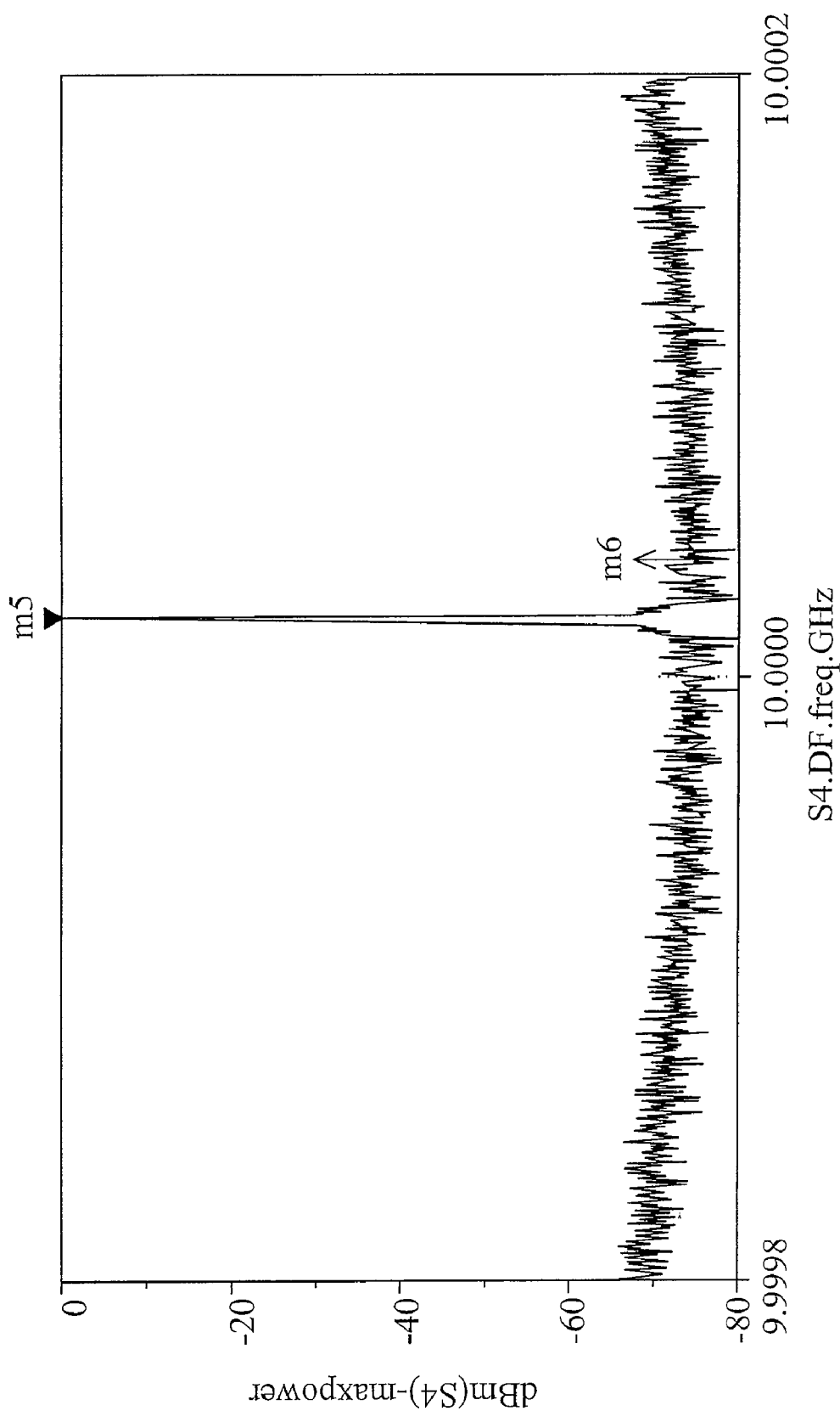

FIGS. 5A and 5B respectively show simulated results of a frequency synthesizer using a conventional MASH modulator and a MASH modulator according to an embodiment of the invention. Current match of a charge pump in the frequency synthesizers is 1% and a fractional input value thereof is 0.001. From the simulated results, it is found that the MASH modulator according to an embodiment of the invention achieves a 6 dB reduction in fractional spur.

Figure 6:
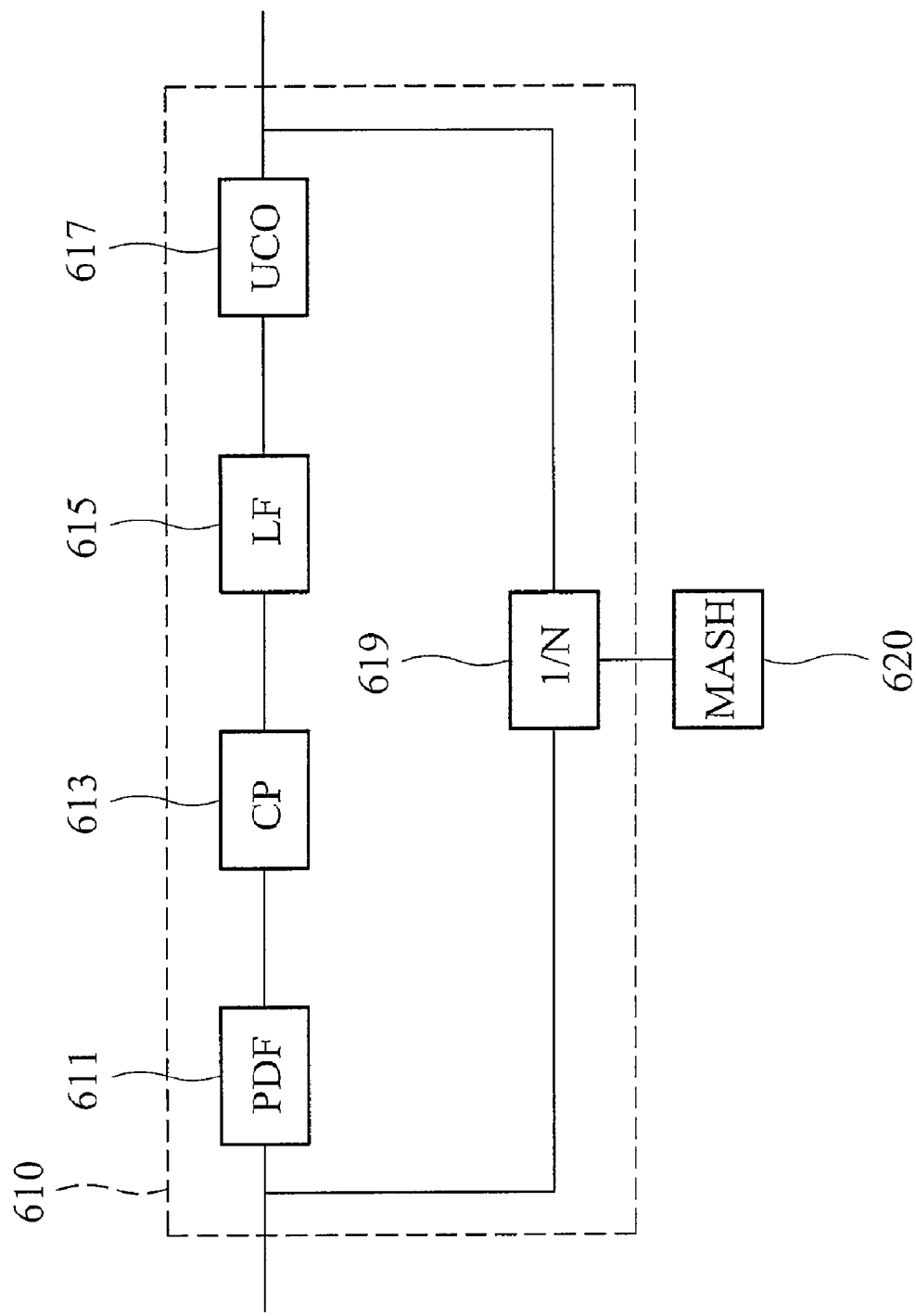
FIG. 6 is a block diagram of a frequency synthesizer according to an embodiment of the invention.

FIG. 6 is a block diagram of a frequency synthesizer according to an embodiment of the invention. The frequency synthesizer 600 comprises a phase locked loop (PLL) 610 and the disclosed MASH accumulator 620. The phase locked loop 610 comprises a frequency divider 619 and the disclosed MASH accumulator 620 is coupled thereto. More specifically, the phase locked loop 610 further comprises a phase frequency detector (PFD) 611, a charge pump (CP) 613, a loop filter 615, and a voltage controlled oscillator (VCO) 617 connected in cascade. The frequency divider 619 is arranged in a feedback path of the phased locked loop 610.

The invention provides a MASH modulator and a frequency synthesizer having the same. The MASH modulator of the invention requires few logic circuits to reduce the in-band fractional spur. The MASH modulator of the invention requires less stringent current matching in a frequency synthesizer than conventional technology.

While the invention has been described by way of example and in terms of preferred embodiment, it is to be understood that the invention is not limited thereto. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A MASH modulator, comprising:
   first, second, and third cascaded accumulators;
   first and second adders respectively coupled to the first and second accumulators;
   a first delay unit coupled between the first and second adders;
   a second delay unit coupled between the second adder and the third accumulator;
   first and second multipliers, each coupled between a corresponding adder and a corresponding accumulator, multiplying an output value of the corresponding accumulator by a first predetermined number;
   a third multiplier, coupled between the second delay unit and the third accumulator, multiplying an output value of the third accumulator by the first predetermined number;
   a third adder, coupled between the first adder and an output of the MASH modulator, adding a second predetermined number to an output value from the first adder;
   a fourth adder, coupled to an input of the MASH modulator, adding a third predetermined number to an input value thereof;
   a fourth multiplier, coupled between the fourth adder and an input of the first accumulator, multiplying an output value of the fourth adder by a fourth predetermined number;
   wherein the third predetermined number is a negative of the second predetermined number, the fourth predetermined number is an inverse of the first predetermined number, and the predetermined numbers are determined according to the input value.

2. The MASH modulator as claimed in claim 1, wherein the first, second, third and fourth predetermined numbers are respectively 2, −1, 1, ½ when the input value is approximately 0.

3. The MASH modulator as claimed in claim 1, wherein the first, second, third and fourth predetermined numbers are respectively 2, 0, 0, ½ when the input value is approximately 1.

4. A frequency synthesizer, comprising:
   a phase locked loop (PLL) having a frequency divider; and
   a MASH modulator coupled to the frequency divider and comprising:
     first, second, and third cascaded accumulators;
     first and second adders respectively coupled to the first and second accumulators;
     a first delay unit coupled between the first and second adders;
     a second delay unit coupled between the second adder and the third accumulator;
     first and second multipliers, each coupled between a corresponding adder and a corresponding accumulator, multiplying an output value of the corresponding accumulator by a first predetermined number;
     a third multiplier, coupled between the second delay unit and the third accumulator, multiplying an output value of the third accumulator by the first predetermined number;
     a third adder, coupled between the first adder and an output of the MASH modulator, adding a second predetermined number to an output value from the first adder;
     a fourth adder, coupled to an input of the MASH modulator, adding a third predetermined number to an input value thereof;
     a fourth multiplier, coupled between the fourth adder and an input of the first accumulator, multiplying an output value of the fourth adder by a fourth predetermined number;
   wherein the third predetermined number is a negative of the second predetermined number, the fourth predetermined number is an inverse of the first predetermined number, and the predetermined numbers are determined according to the input value.

5. The frequency synthesizer as claimed in claim 4, wherein the first, second, third and fourth predetermined numbers are respectively 2, −1, 1, ½ when the input value is approximately 0.

6. The frequency synthesizer as claimed in claim 4, wherein the first, second, third and fourth predetermined numbers are respectively 2, 0, 0, ½ when the input value is approximately 1.

7. A MASH modulator, receiving a fractional input value, comprising:
   three cascaded first order sigma delta modulators (SDMs) each comprising an accumulator therein;
   a plurality of first multipliers each coupled to a corresponding accumulator;
   a first adder receiving the fractional input value
   a second multiplier coupled between the first adder and the cascaded first order sigma delta modulators;
   a second adder, coupled to the cascaded first order sigma delta modulators, for generating an integer output value;
   wherein the first adder adds a first predetermined number to the fractional input value, the second multiplier multiplies an output value of the first adder by a second predetermined number, each of the first multipliers multiplies an output value of the corresponding accumulator by a third predetermined number, and the second adders adds a fourth predetermined number to an output value of the three cascaded first order sigma delta modulators, wherein the fourth predetermined number is a negative of the first predetermined number, the third predetermined number is an inverse of the second predetermined number, and the predetermined numbers are determined according to the fractional input value.

8. The MASH modulator as claimed in claim 7, wherein the first, second, third and fourth predetermined numbers are respectively 1, ½, 2, −1 when the input value is approximately 0.

9. The MASH modulator as claimed in claim 7, wherein the first, second, third and fourth predetermined numbers are respectively 0, ½, 2, 0 when the input value is approximately 1.

10. A frequency synthesizer, comprising:
    a phase locked loop (PLL) having a frequency divider; and
    a MASH modulator coupled to the frequency divider, the MASH modulator receiving a fractional input value, comprising:
      three cascaded first order sigma delta modulators (SDMs) each comprising an accumulator therein;

a plurality of first multipliers each coupled to a corresponding accumulator;
a first adder receiving the fractional input value
a second multiplier coupled between the first adder and the cascaded first order sigma delta modulators;
a second adder, coupled to the cascaded first order sigma delta modulators, for generating an integer output value;
wherein the first adder adds a first predetermined number to the fractional input value, the second multiplier multiplies an output value of the first adder by a second predetermined number, each of the first multipliers multiplies an output value of the corresponding accumulator by a third predetermined number, and the second adders adds a fourth predetermined number to an output value of the three cascaded first order sigma delta modulators, wherein the fourth predetermined number is a negative of the first predetermined number, the third predetermined number is an inverse of the second predetermined number, and the predetermined numbers are determined according to the fractional input value.

11. The frequency synthesizer as claimed in claim 10, wherein the first, second, third and fourth predetermined numbers are respectively 1, ½, 2, −1 when the input value is approximately 0.

12. The frequency synthesizer as claimed in claim 10, wherein the first, second, third and fourth predetermined numbers are respectively 0, ½, 2, 0 when the input value is approximately 1.

* * * * *